US011515397B2

(12) United States Patent
Stamper et al.

(10) Patent No.: US 11,515,397 B2
(45) Date of Patent: Nov. 29, 2022

(54) III-V COMPOUND SEMICONDUCTOR LAYER STACKS WITH ELECTRICAL ISOLATION PROVIDED BY A TRAP-RICH LAYER

(71) Applicant: GLOBALFOUNDRIES U.S. Inc., Santa Clara, CA (US)

(72) Inventors: Anthony K. Stamper, Williston, VT (US); Siva P. Adusumilli, South Burlington, VT (US); Vibhor Jain, Essex Junction, VT (US); Steven Bentley, Menands, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 233 days.

(21) Appl. No.: 16/934,669

(22) Filed: Jul. 21, 2020

(65) Prior Publication Data

US 2022/0029000 A1    Jan. 27, 2022

(51) Int. Cl.
*H01L 29/66* (2006.01)
*H01L 29/20* (2006.01)
*H01L 29/778* (2006.01)
*H01L 29/06* (2006.01)
*H01L 21/763* (2006.01)
*H01L 21/8234* (2006.01)
*H01L 29/36* (2006.01)

(52) U.S. Cl.
CPC ...... *H01L 29/66462* (2013.01); *H01L 21/763* (2013.01); *H01L 21/823493* (2013.01); *H01L 29/0684* (2013.01); *H01L 29/2003* (2013.01); *H01L 29/36* (2013.01); *H01L 29/66431* (2013.01); *H01L 29/778* (2013.01); *H01L 29/7786* (2013.01)

(58) Field of Classification Search
CPC ........ H01L 29/66462; H01L 29/66431; H01L 29/778; H01L 29/7786; H01L 29/0684; H01L 29/36; H01L 21/763; H01L 21/7605; H01L 21/823493
See application file for complete search history.

(56) References Cited

U.S. PATENT DOCUMENTS

| 8,665,013 | B2 | 3/2014 | Saunders |
| 9,171,911 | B2 | 10/2015 | Zhou et al. |
| 9,685,545 | B2 | 6/2017 | Tipirneni et al. |
| 10,192,779 | B1 | 1/2019 | Shank et al. |
| 10,312,131 | B2 | 6/2019 | Lidow et al. |
| 2015/0115327 | A1* | 4/2015 | Briere ............... H01L 29/66462 257/194 |
| 2019/0371886 | A1 | 12/2019 | Radosavljevic et al. |
| 2021/0225770 | A1* | 7/2021 | Lin ................... H01L 21/31144 |

FOREIGN PATENT DOCUMENTS

TW    202006835 A  *  2/2020    ............. C30B 29/06

* cited by examiner

*Primary Examiner* — Joseph C. Nicely
(74) *Attorney, Agent, or Firm* — Thompson Hine LLP; Anthony Canale

(57) ABSTRACT

Semiconductor structures including electrical isolation and methods of forming a semiconductor structure including electrical isolation. A layer stack is formed on a semiconductor substrate comprised of a single-crystal semiconductor material. The layer stack includes a semiconductor layer comprised of a III-V compound semiconductor material. A polycrystalline layer is formed in the semiconductor substrate. The polycrystalline layer extends laterally beneath the layer stack.

20 Claims, 5 Drawing Sheets

III-V COMPOUND SEMICONDUCTOR LAYER STACKS WITH ELECTRICAL ISOLATION PROVIDED BY A TRAP-RICH LAYER

BACKGROUND

The present invention relates to semiconductor device fabrication and integrated circuits and, more specifically, to semiconductor structures including electrical isolation and methods of forming a semiconductor structure including electrical isolation.

Device structures, such as high-voltage power electronic devices, are susceptible to high capacitance and body-to-body leakage when formed using a bulk semiconductor wafer. A measure that may be taken to reduce the susceptibility is to provide the bulk semiconductor wafer with triple well isolation that surrounds an active device region containing the device structure. Another measure that may be taken to reduce the susceptibility is to replace the bulk wafer with a silicon-on-insulator wafer in which a top silicon layer furnishes an active device region and a buried oxide (BOX) layer is arranged between the active device region and the substrate beneath the buried insulator layer.

High-voltage power electronic devices, such as high-electron-mobility transistors, may be fabricated using III-V compound semiconductors to exploit their material properties, such as a carrier mobility that is greater than the carrier mobility of silicon. III-V compound semiconductors are obtained by combining group III elements (aluminum, gallium, indium) with group V elements (nitrogen, phosphorus, arsenic, antimony). A high-electron-mobility transistor may include a heterojunction between III-V compound semiconductor materials having different band gaps, such as a heterojunction between binary gallium nitride and trinary aluminum-gallium nitride. During operation, a two-dimensional electron gas is formed near an interface at the heterojunction of the high-electron-mobility transistor. The two-dimensional electron gas defines the channel of the high-electron-mobility transistor.

Although such measures have proven suitable for their intended purpose, semiconductor structures with improved electrical isolation and methods of forming a semiconductor structure including improved electrical isolation are needed.

SUMMARY

In an embodiment of the invention, a structure includes a semiconductor substrate comprised of a single-crystal semiconductor material, a layer stack on the semiconductor substrate, and a polycrystalline layer in the semiconductor substrate. The layer stack includes a semiconductor layer comprised of a III-V compound semiconductor material, and the polycrystalline layer extends laterally beneath the layer stack.

In an embodiment of the invention, a method includes forming a polycrystalline layer in a semiconductor substrate comprised of a single-crystal semiconductor material, and forming a layer stack on the semiconductor substrate. The layer stack includes a semiconductor layer comprised of a III-V compound semiconductor material, and the polycrystalline layer extends laterally beneath the layer stack.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
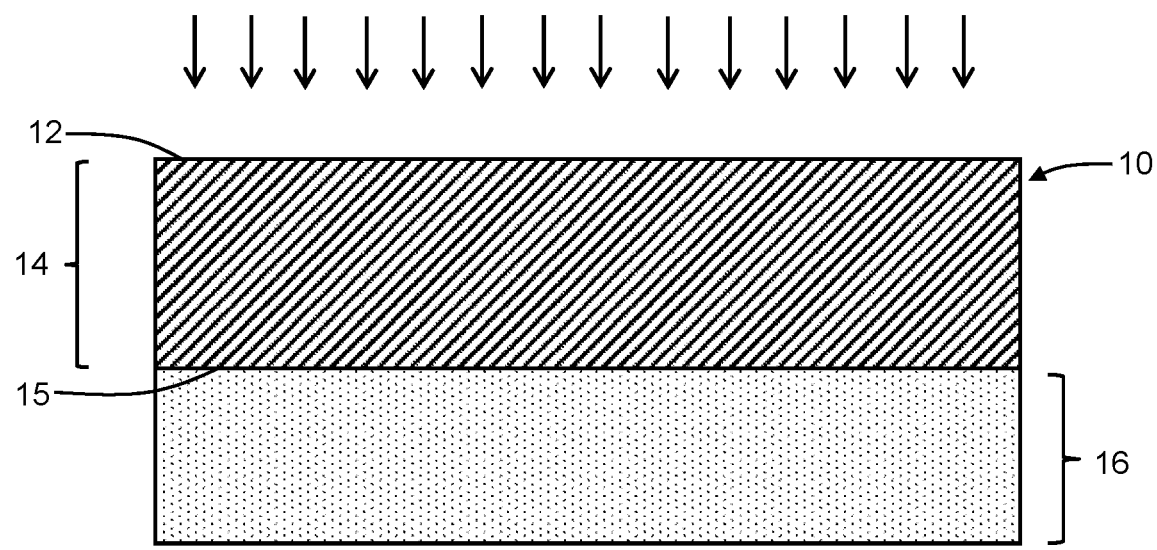
FIGS. 1-4 are cross-sectional views of a structure at successive fabrication stages of a processing method in accordance with embodiments of the invention.

With reference to FIG. 1 and in accordance with embodiments of the invention, a semiconductor substrate 10 is provided that contains a single-crystal semiconductor material, such as single-crystal silicon. The semiconductor substrate 10 may be a bulk substrate containing single-crystal semiconductor material (e.g., single-crystal silicon). In an alternative embodiment, the semiconductor substrate 10 may be a silicon-on-insulator substrate or an engineered substrate. In an embodiment, the semiconductor substrate 10 may be a high-resistivity bulk substrate containing single-crystal silicon having an electrical resistivity greater than or equal to 1000 ohm-cm. In an embodiment, the semiconductor substrate 10 may be a high-resistivity bulk substrate containing single-crystal silicon having an electrical resistivity in a range from 1,000 ohm-cm to 50,000 ohm-cm. In an alternative embodiment, the semiconductor substrate 10 may be a low-resistivity bulk substrate containing single-crystal silicon having an electrical resistivity less than 1000 ohm-cm. In an embodiment, the single-crystal semiconductor material of the semiconductor substrate 10 may be oriented with a <111> surface normal. The choice of substrate resistivity is determined by the need to minimize radiofrequency losses in the semiconductor substrate 10 for active devices, like field effect transistors, and passive devices, such as inductors or transmission lines. Increasing the resistivity of the semiconductor substrate 10 can reduce the radiofrequency losses for active and passive devices.

An implanted layer 14 containing damaged or amorphous semiconductor material is formed in the semiconductor substrate 10. The implanted layer 14 may be formed by an ion implantation process that introduces energetic ions, as indicated diagrammatically by the single-headed arrows, with ion trajectories that travel in paths through the semiconductor substrate 10. The energetic ions lose energy along their paths via stochastic scattering events with atomic nuclei and electrons in the traversed semiconductor material. Energy lost in nuclear collisions displaces target atoms of the semiconductor substrate 10 from their original lattice sites, which damages the crystal lattice structure of the semiconductor substrate 10 and generates point defects. The crystal lattice structure of the semiconductor substrate 10 is damaged or amorphized within the implanted layer 14 in comparison with an undamaged region 16 of the single-crystal semiconductor material of the semiconductor substrate 10 positioned below a lower boundary of the implanted layer 14. The implanted layer 14 of the semiconductor substrate 10 may be changed from crystalline semiconductor material (e.g., single-crystal silicon) to damage or amorphous semiconductor material (e.g., amorphous silicon) as a consequence of the use of a high dose of the implanted species.

The ions may be generated from a suitable source gas and implanted into the semiconductor substrate 10 with one or more implantation conditions using an ion implantation tool. The implantation conditions (e.g., ion species, dose, energy) for the ion implantation process may be selected to tune the characteristics of the implanted layer 14. In an embodiment, the ions may be generated from a noble gas, such as He, Ne, Ar, Kr, Xe, Rn, or Og. In an alternative embodiment, the ions may be O ions, N ions, Ge ions, Si ions, or other elements that either do not dope or minimally dope the semiconductor wafer. In an embodiment in which the semiconductor substrate 10 is to remain crystalline at the top surface 12, then the ion dose is selected to be less than a threshold ion dose beyond which recrystallization of the damaged semiconductor material in the implanted layer 14 by a subsequent anneal is not possible. In an embodiment, the Ar ion dose may be greater than $1 \times 10^{14}$ ions/cm$^2$. In an embodiment, the Ar ion dose may be within a range of $1 \times 10^{14}$ ions/cm$^2$ to $5 \times 10^{15}$ ions/cm$^2$. In an embodiment, the Ar ion energy may be in a range of about 30 keV to about 1000 keV. The energy and dose for other implanted noble gas species could be similar. The energy and dose for the non-noble gas elements could be similar or lower. For example, if O is used, then a much lower dose, i.e., 10 times to 1000 times less, could be used. The ion implantation conditions may include a single implantation, multiple implantations performed at different energies, segmented implantations, etc. A thin silicon dioxide layer (not shown) may be applied to the top surface 12 of the semiconductor substrate 10 before performing the ion implantation process and removed after the ion implantation process.

Figure 2:
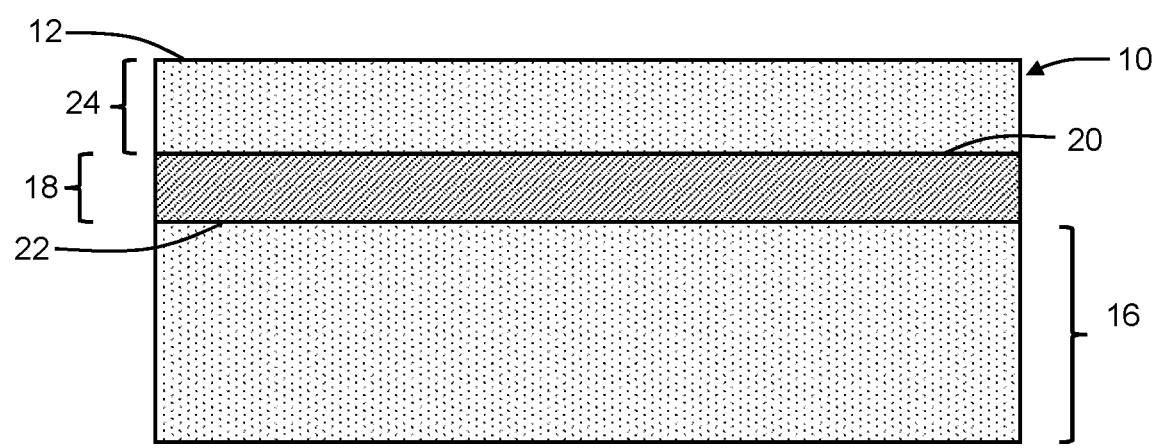

With reference to FIG. 2 in which like reference numerals refer to like features in FIG. 1 and at a subsequent fabrication stage of the processing method, the semiconductor substrate 10 is subjected to a thermal treatment (i.e., annealing process), which subjects the implanted layer 14 (FIG. 1) of the semiconductor substrate 10 to the thermal treatment. In an embodiment, the thermal treatment used to thermally treat the implanted layer 14 of the semiconductor substrate 10 may be a rapid thermal anneal. In an embodiment, the rapid thermal anneal may be performed using, for example, a bank of flash lamps that heat the semiconductor substrate 10 to a peak temperature in a range of 900° C. to 1125° C. with a dwell time at the peak temperature of 30 milliseconds to 5 seconds and, in a particular embodiment, the peak temperature may be 1000° C. held for a dwell time of less than or equal to 1 second.

The thermal treatment recrystallizes a portion of the damaged semiconductor material of the implanted layer 14 into a polycrystalline layer 18 in the semiconductor substrate 10. The polycrystalline layer 18 contains grains of polycrystalline semiconductor material (e.g., polysilicon) and defects as residual damage in addition to the polycrystalline grains. The defects may contain trapped atoms of the implanted species (e.g., Ar). The thermal treatment also recrystallizes the damaged semiconductor material of the implanted layer 14 between the polycrystalline layer 18 and the top surface 12 into a layer 24 of the semiconductor substrate 10 that includes single-crystal semiconductor material (e.g., single-crystal silicon). The recrystallized single-crystal semiconductor material in the layer 24 lacks polycrystalline grains and defects in contrast to the polycrystalline layer 18.

In the representative embodiment, the polycrystalline layer 18 may include a single layer of polycrystalline semiconductor material. In an alternative embodiment, multiple layers of polycrystalline semiconductor material may result from the implantation and thermal treatment if multiple implant energies (i.e., implant depths) are used to form the implanted layer 14. The recrystallized single-crystal layer 24 is located between an upper boundary 20 of the polycrystalline layer 18 and the top surface 12, and the semiconductor substrate 10 includes single-crystal semiconductor material below a lower boundary 22 of the polycrystalline layer 18. In an embodiment, the polycrystalline layer 18 may be thinner than the implanted layer 14 (FIG. 1). In an alternative embodiment in which the implanted layer 14 is recrystallized by a furnace anneal as the thermal treatment, the polycrystalline layer 18 may extend fully to the top surface 12 of the semiconductor substrate 10. The furnace anneal may performed within a temperature range of 900° C. to 1100° C.

The polycrystalline layer 18 may be characterized as a trap-rich material having an electrical resistivity that is greater than or equal to the electrical resistivity of the single-crystal semiconductor material of the semiconductor substrate 10. In an embodiment, the polycrystalline layer 18 may have an electrical resistivity that is greater than or equal to 1,000 ohm-cm. In an embodiment, the electrical resistivity of the polycrystalline layer 18 may be within a range of 10,000 ohm-cm to 1,000,000 ohm-cm. In an embodiment, the single-crystal semiconductor material of the substrate may have an electrical resistivity of 1,000 to 10,000 ohm-cm, and the polycrystalline layer 18 may have an electrical resistivity that is 10 times to 100 times greater (i.e., within a range of 10,000 to 1,000,000 ohm-cm).

Figure 3:
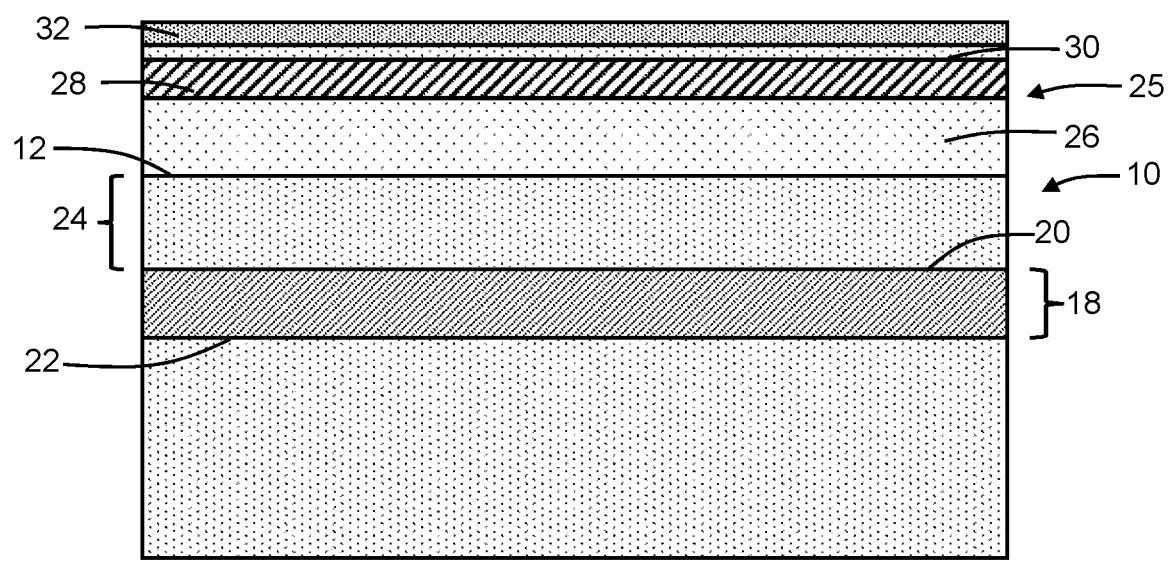

With reference to FIG. 3 in which like reference numerals refer to like features in FIG. 2 and at a subsequent fabrication stage of the processing method, a layer stack 25 containing one or more non-IV group semiconductor layers is formed on the top surface 12 of the semiconductor substrate 10. In an embodiment, the layer stack 25 may include one or more layers comprised of group III-V compound semiconductor materials. In an embodiment, the layer stack 25 may include multiple layers comprised of different group III-V compound semiconductor materials.

In an embodiment, the layer stack 25 may include a buffer layer 26, a channel layer 28, a spacer layer 30, and a barrier layer 32. The layers 26, 28, 30, 32 may be serially formed using an epitaxial growth process, such as metalorganic chemical vapor deposition. The layers 26, 28, 30, 32 may each have a crystal structure that is single crystal or, alternatively, substantially single crystal with varying levels of crystalline defectivity present. The layers 26, 28, 30, 32 may further have multiple sub-layers with varying composition or doping. The buffer layer 26 may have multiple sub-layers that are tailored in terms of material composition, doping, and/or layer thickness to accommodate lattice mismatch between the material of the semiconductor substrate 10 and the material of the channel layer 28. The buffer layer 26 may include a seed layer containing a material, such as aluminum nitride, adjacent to the semiconductor substrate 10. The channel layer 28, which is disposed over the buffer layer 26, may contain a III-V compound semiconductor material, such as gallium nitride. The spacer layer 30 and the barrier layer 32 are disposed over the channel layer 28 with the spacer layer 30 between the channel layer 28 and the barrier layer 32. The spacer layer 30 may be thin and may contain a material such as aluminum nitride. The barrier layer 32 may contain a material, such as aluminum gallium nitride, aluminum nitride or indium aluminum nitride, that provides an interface with the channel layer 28 of different composition. The spacer layer 30 and barrier layer 32 provide a contribution, along with the material properties of the channel layer 28, to create a two-dimensional electron gas, during device operation, at the interface that is filled with highly-mobile and abundant electrons.

Figure 4:
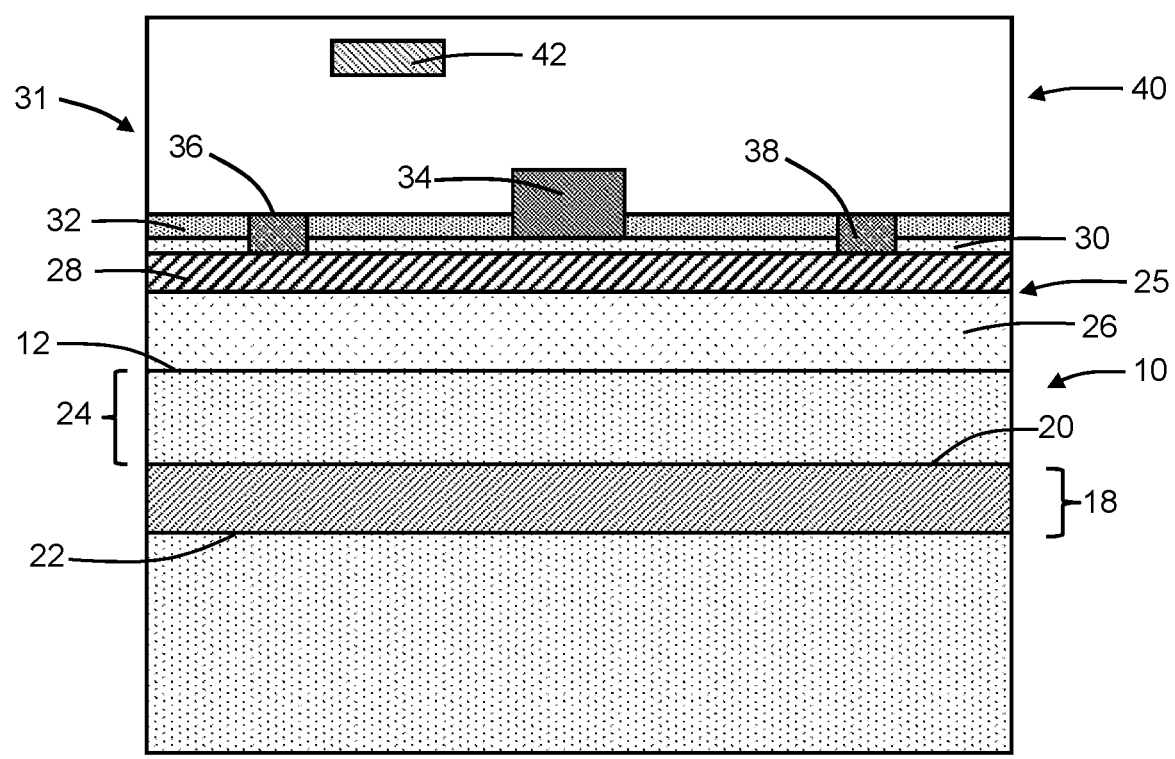

With reference to FIG. 4 in which like reference numerals refer to like features in FIG. 3 and at a subsequent fabrication stage of the processing method, an active device structure 31 may be formed using the layer stack 25 of compound III-V semiconductor materials. For example, the active device structure 31 may be a high-electron-mobility transistor (HEMT) that includes a gate electrode 34, a source region 36, and a drain region 38. The gate electrode 34 may be comprised of a metal, such as a metal nitride, and may be patterned with lithography and etching processes to define a given shape. The source region 36 and drain region 38 may be formed by patterning openings in the spacer layer 30 and barrier layer 32 with lithography and etching processes, and then depositing a metal, such as a metal nitride, that may be patterned with lithography and etching processes. The source region 36 and drain region 38 may directly contact the channel layer 28, and metal atoms from the source and drain regions 36, 38 may diffuse into the channel layer 28. While not shown, the layer stack 25 may be patterned with lithography and etching processes in association with the formation of the active device structure 31 to define a raised mesa that is encapsulated by subsequently-deposited dielectric material.

Middle-of-line processing and back-end-of-line processing follow, which includes formation of contacts, vias, and wiring for an interconnect structure 40 that is coupled with the active device structure 31. In an embodiment, a passive device 42, such as an inductor, a capacitor, a resistor, or a transmission line, may be formed by back-end-of-line processing in the interconnect structure 40. In an embodiment, the active device structure 31 may be absent and only the passive device 42 may be present.

The polycrystalline layer 18, which is characterized by a high electrical resistance, may improve the linearity of the active device structure 31 during operation.

Figure 5:
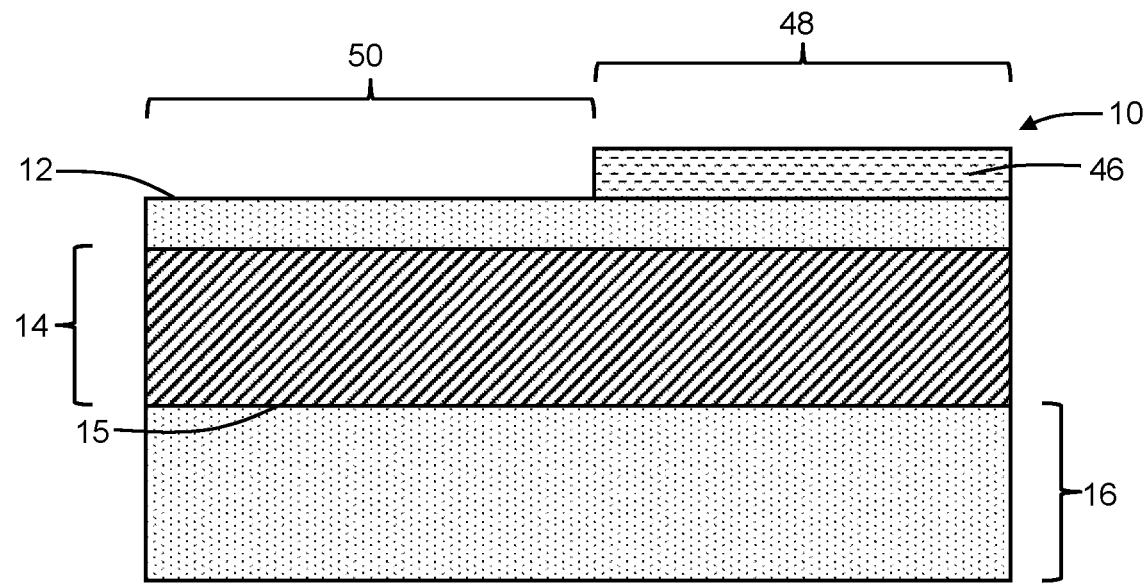
FIGS. 5-7 are cross-sectional views of a structure at successive fabrication stages of a processing method in accordance with alternative embodiments of the invention.

With reference to FIG. 5 in which like reference numerals refer to like features in FIG. 2 and at a subsequent fabrication stage of a processing method in accordance with alternative embodiments, a dielectric layer 46 may be deposited on the top surface 12 of the semiconductor substrate 10 after the implanted layer 14 is formed, but before the thermal treatment that converts the implanted layer 14 into the polycrystalline layer 18. The dielectric layer 46 may be patterned with lithography and etching processes such that a region 48 of the semiconductor substrate 10 is covered and a region 50 of the semiconductor substrate 10 is uncovered (i.e., exposed). The dielectric layer 46 may be comprised of silicon nitride and/or silicon dioxide. In an embodiment, the dielectric layer 46 may include a sub-layer of silicon dioxide formed by thermal oxidation and a thicker sub-layer of silicon nitride formed by liquid phase chemical vapor deposition on the silicon dioxide sub-layer.

Figure 6:
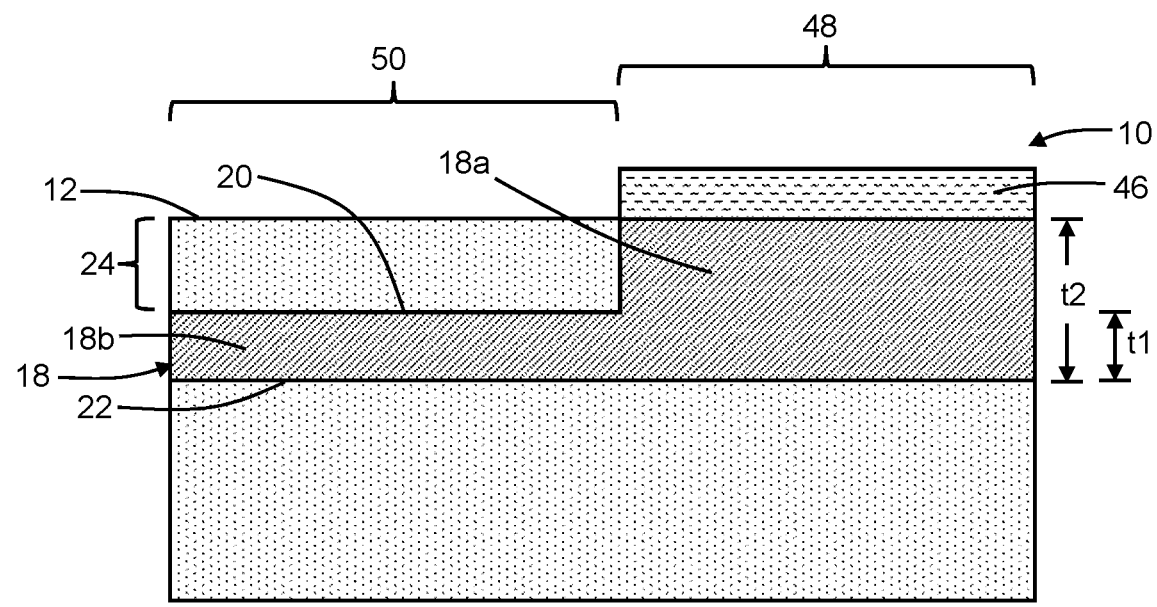

With reference to FIG. 6 in which like reference numerals refer to like features in FIG. 5 and at a subsequent fabrication stage of the processing method, the thermal treatment is performed as described in connection with FIG. 2 to transform the implanted layer 14 into the polycrystalline layer 18. The layer 24 of single-crystal semiconductor material is formed from the implanted layer 14 during the thermal treatment and is positioned between the polycrystalline layer 18 and the top surface 12 in the region 50 in which the dielectric layer 46 is absent from the top surface 12. A section 18a of the polycrystalline layer 18 is thicker beneath the dielectric layer 46 in the region 48 than a section 18b of the polycrystalline layer 18 in the region 50. Specifically, the polycrystalline layer 18 in region 50 has a thickness, t1, and the section 18a of the polycrystalline layer 18 in region 48 has a thickness, t2, that is greater than the thickness, t1. In an embodiment, the section 18a of the polycrystalline layer 18 may have an upper boundary that coincides or substantially coincides with the top surface 12 of the semiconductor substrate 10. In an embodiment, the sections 18a, 18b of the polycrystalline layer 18 and the single-crystal layer 24 may have thicknesses in a range of about one hundred (100) nanometers (nm) to about one (1) micron (µm).

Figure 7:
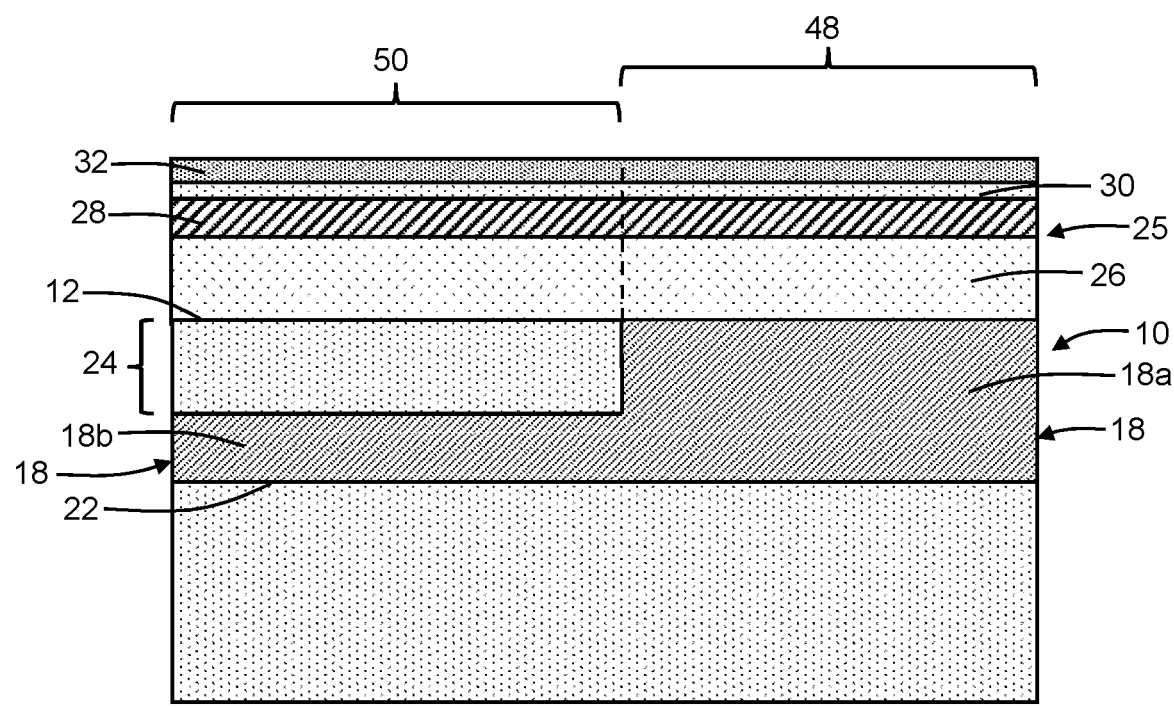

With reference to FIG. 7 in which like reference numerals refer to like features in FIG. 6 and at a subsequent fabrication stage of the processing method, the dielectric layer 46 is removed, and the layer stack 25 is formed on the top surface 12 of the semiconductor substrate 10 as described in connection with FIG. 3. In an embodiment, the active device structure 31 (FIG. 4) may be subsequently formed in the region 50 using the layer stack 25.

The section of the layer stack 25 in region 48, which is formed over the thicker section 18a of the polycrystalline layer 18, has a different crystallinity state than the section of the layer stack 25 in region 50, which is formed over the layer 24 of single-crystal semiconductor material. In particular, the section of the layer stack 25 in region 48 may be disordered due to crystallization that is retarded due to the existence of the polycrystalline layer 18 in region 48 as a non-single-crystal template at the top surface 12 for the epitaxial growth process, and the layer stack 25 in region 50 may have a crystal structure that is single crystal or substantially single crystal. In an embodiment, the section of the layer stack 25 formed over the thicker section 18a of the polycrystalline layer 18 may contain amorphous III-V semiconductor material in the portions of the layers 26, 28, 30, 32 associated with this section of the layer stack 25. The section of the layer stack 25 formed in region 48 may reduce mechanical stress, which may permit the use of a thinner semiconductor substrate 10, and the section of the layer stack 25 formed in region 50 may provide electrical isolation for the subsequently-formed active device structure 31.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate comprising a single-crystal semiconductor material, the semiconductor substrate having a top surface;
   a layer stack positioned on the top surface of the semiconductor substrate, the layer stack including a first layer comprising a first III-V compound semiconductor material; and
   a polycrystalline layer in the semiconductor substrate, the polycrystalline layer extending laterally beneath the layer stack, the polycrystalline layer including a first section having a first thickness and a second section having a second thickness that is greater than the first thickness, and the second section of the polycrystalline layer has a boundary that substantially coincides with the top surface of the semiconductor substrate.

2. The structure of claim 1 wherein the single-crystal semiconductor material of the semiconductor substrate is oriented with a <111> surface normal.

3. The structure of claim 2 wherein the polycrystalline layer has an electrical resistivity that is within a range of 10,000 ohm-cm to 1,000,000 ohm-cm.

4. The structure of claim 1 wherein the polycrystalline layer includes an upper boundary and a lower boundary, and the semiconductor substrate includes a layer of the single-crystal semiconductor material between the top surface and the upper boundary of the polycrystalline layer.

5. The structure of claim 1 wherein the first III-V compound semiconductor material of the first layer has a crystal structure that is substantially single crystal.

6. The structure of claim 1 further comprising:
   an active device including a gate electrode on the layer stack.

7. The structure of claim 6 wherein the active device is a high-electron-mobility transistor.

8. The structure of claim 1 further comprising:
   an interconnect structure over the layer stack and the polycrystalline layer; and
   a passive device in the interconnect structure.

9. The structure of claim 1 wherein the layer stack includes a second layer comprising a second III-V compound semiconductor material, and the second III-V compound semiconductor material has a different composition than the first III-V compound semiconductor material.

10. The structure of claim 9 wherein the first III-V compound semiconductor material is gallium nitride.

11. The structure of claim 1 wherein the first III-V compound semiconductor material of the first layer over the first section of the polycrystalline layer is substantially single crystal, and the first III-V compound semiconductor material of the first layer over the second section of the polycrystalline layer is disordered.

12. A structure comprising:
    a semiconductor substrate comprising a single-crystal semiconductor material;
    a layer stack on the semiconductor substrate, the layer stack including a first layer comprised of a first III-V compound semiconductor material; and
    a polycrystalline layer in the semiconductor substrate, the polycrystalline layer extending laterally beneath the layer stack, the polycrystalline layer including a first section having a first thickness and a second section having a second thickness that is greater than the first thickness,
    wherein the first III-V compound semiconductor material of the first layer over the first section of the polycrystalline layer is substantially single crystal, and the first III-V compound semiconductor material of the first layer over the second section of the polycrystalline layer is disordered.

13. The structure of claim 12 wherein the layer stack includes a second layer comprising a second III-V compound semiconductor material, and the second III-V compound semiconductor material has a different composition than the first III-V compound semiconductor material.

14. The structure of claim 12 further comprising:
    an active device including a gate electrode on the layer stack over the first section of the polycrystalline layer.

15. A method comprising:
    forming a polycrystalline layer in a semiconductor substrate, of wherein the semiconductor substrate comprises a single-crystal semiconductor material; and
    forming a layer stack positioned on a top surface of the semiconductor substrate,
    wherein the layer stack includes a layer comprising a III-V compound semiconductor material, the polycrystalline layer extends laterally beneath the layer stack, the polycrystalline layer includes a first section having a first thickness and a second section having a second thickness that is greater than the first thickness, and the second section of the polycrystalline layer has a boundary that substantially coincides with the top surface of the semiconductor substrate.

16. The method of claim 15 wherein forming the polycrystalline layer in the semiconductor substrate comprised of the single-crystal semiconductor material comprises:
    implanting ions into the semiconductor substrate to produce crystalline damage to the single-crystal semiconductor material of the semiconductor substrate in an implanted layer beneath the top surface of the semiconductor substrate; and recrystallizing the implanted layer of the semiconductor substrate with an annealing process to produce the polycrystalline layer.

17. The method of claim 16 further comprising:

applying a patterned dielectric layer over the top surface of the semiconductor substrate that exposes a first region of the semiconductor substrate and that covers a second region of the semiconductor substrate.

18. The method of claim 17 wherein the patterned dielectric layer is applied before the implanted layer of the semiconductor substrate is recrystallized.

19. The method of claim 15 further comprising:

forming a gate electrode of an active device on the layer stack.

20. The method of claim 15 wherein the single-crystal semiconductor material of the semiconductor substrate is oriented with a <111> surface normal.

* * * * *